United States Patent [19]
McDevitt et al.

[11] Patent Number: 5,494,860
[45] Date of Patent: Feb. 27, 1996

[54] TWO STEP ANNEALING PROCESS FOR DECREASING CONTACT RESISTANCE

[75] Inventors: Thomas L. McDevitt, Underhill; Scott L. Pennington, South Burlington; Michael A. Smey, Burlington, all of Vt.

[73] Assignee: International Business Machines Corporation, Armonk, N.Y.

[21] Appl. No.: 404,080

[22] Filed: Mar. 14, 1995

[51] Int. Cl.$^6$ .................................................. H01L 21/44
[52] U.S. Cl. ..................... 437/246; 437/189; 437/192; 437/194; 437/198; 437/200; 437/247
[58] Field of Search ............................ 437/246, 247, 437/196, 197, 198, 200, 192, 189, 190, 194

[56] References Cited

U.S. PATENT DOCUMENTS

| | | | |
|---|---|---|---|
| 4,983,547 | 1/1991 | Arima et al. | 437/246 |
| 4,988,423 | 1/1991 | Yamamoto et al. | 204/192 |
| 5,200,359 | 4/1993 | Pearey et al. | 437/192 |
| 5,236,868 | 8/1993 | Nulman | 437/200 |
| 5,238,872 | 8/1993 | Thalapaneni | 437/190 |
| 5,242,860 | 9/1993 | Nulman et al. | 437/200 |
| 5,275,715 | 1/1994 | Tuttle | 205/123 |
| 5,290,731 | 3/1994 | Sugano et al. | 437/174 |
| 5,312,772 | 5/1994 | Yokoyama et al. | 437/192 |
| 5,358,901 | 10/1994 | Fiordalice et al. | 437/246 |
| 5,407,863 | 4/1995 | Katrura et al. | 437/196 |

FOREIGN PATENT DOCUMENTS 63-181422 of 1988 Japan.
5-160068 of 1991 Japan.
4-3403944 of 1992 Japan.

OTHER PUBLICATIONS

Aitken et al. "Wet forming Gas Anneal to Remove Radiation Damage From Polysilicon Gate MOSFETS" *TDB* 08–82, 1883–1684 (1982).
Howard "Process for Low Contact Resistance Shallow Junction Structures With . . . " *TDB* 06–81, 471–472 (1981).
Hildick "Forming Low Metal to Metal Contact Resistance in Multilevel Metallization . . . " *TDB* 06–76, 20 (1976).

*Primary Examiner*—Tuan H. Nguyen
*Attorney, Agent, or Firm*—Heslin & Rothenberg

[57] ABSTRACT

A process for decreasing the electrical resistance of a circuit element containing titanium metal, in applications requiring annealing in hydrogen, is disclosed. The process requires, prior to exposure to hydrogen, heating the titanium-containing circuit element in an inert, hydrogen-free atmosphere. The process thus involves a first step of annealing the titanium-containing circuit element in an inert, hydrogen-free atmosphere, such as nitrogen or other inert gas, at 300° C. to 400° C. for 10 to 60 minutes, followed by a second step of annealing in a hydrogen-containing atmosphere, such as hydrogen gas or forming gas, at 350° C. to 450° C. for at least 20 minutes. The resulting structures have both low resistance and tight variability.

18 Claims, 1 Drawing Sheet

TWO STEP ANNEALING PROCESS FOR DECREASING CONTACT RESISTANCE

FIELD OF THE INVENTION

The invention relates to a process for decreasing the electrical resistance of a circuit element containing titanium metal, in applications requiring exposure to hydrogen at a temperature exceeding 300° C. The process comprises, prior to exposure to hydrogen, heating the titanium-containing circuit element in an inert, hydrogen-free atmosphere at 300° C. to 400° C. for 10 to 60 minutes.

BACKGROUND OF THE INVENTION

Integrated circuits are produced on a substrate, such as a silicon wafer, by patterning regions in the substrate and by patterning layers on the substrate. Deposited layers of conductive material are an integral part of every integrated circuit, and commonly provide the role of wiring. Such conductors, also referred to as "lines" or "runners," are typically provided at different elevations within the wafer structure. At some locations it becomes necessary to make electrical contact between higher and lower elevation conductive lines on the wafer. This invention concerns a problem associated with making low resistance electrical contact between two different elevation conductive layers. The hitherto unrecognized problem arises when the device contains titanium at the junction of the two levels of metalization and the junction is annealed in a reducing atmosphere. The solution to the problem, however, has broader applicability than just to interlevel metal junctions.

Aluminum is a common material employed as the metalization for lines due in large part to the ease with which it can be deposited and worked and due to its high conductivity. Most commonly, the aluminum materials utilized are alloys of aluminum and copper comprising greater than 95% aluminum. Aluminum lines are often coated with a thin film of titanium or titanium nitride. Although they are highly conductive and readily deposited, lines made from aluminum and its alloys have the one drawback that they readily form aluminum oxide on the surface when exposed even briefly to an oxidizing atmosphere such as air. Aluminum oxide is a highly insulative material which, if left unreduced, leads to a high resistance junction. With increasingly refined design rules for semiconductor devices, the diameter of the connecting hole created in the insulating layer for establishing connection between an upper and lower metalization must be minimized. As the diameter of the contact decreases, the importance of low resistance increases.

The deposition of a layer of titanium metal on top of the aluminum metalization is known in the art (see U.S. Pat. No. 5,200,359). When exposed to an appropriate energy source, the titanium metal is made to react with aluminum oxide on the surface of the aluminum, the aluminum oxide is reduced to aluminum and the titanium scavenges the oxygen. In this process some titanium dioxide appears to be produced at the interface, but it has a much lower electrical resistance than does aluminum oxide and therefore produces a junction of lower resistivity. In addition, a certain portion of the oxygen is transported away from the junction and into the titanium metal layer.

A constraint in fabricating integrated circuits is that so-called "defect states" in dielectrics must be passivated in order to minimize unacceptable electrical leakage. The solution to this problem has been found to involve annealing the device in a reducing atmosphere whereby hydrogen appears to attach to the dangling bonds, thereby greatly reducing stray conductivity.

It has now been discovered that the annealing in a hydrogen-containing atmosphere that is desirable for reducing or passivating the defects states interferes with the titanium's ability to act as a reducing agent. Consequently, the conductivity of metal-metal junctions is reduced.

SUMMARY OF THE INVENTION

It is an object of the present invention to provide a low resistance metal-metal contact while at the same time allowing passivation (minimizing leakage) and the production of a more mechanically robust junction. This object is accomplished by the process of the invention which in one aspect relates to a method for decreasing the electrical resistance of a circuit element containing titanium metal, when the circuit element containing titanium metal requires exposure to hydrogen at a temperature exceeding 300° C. The method comprises, prior to exposure to hydrogen at a temperature exceeding 300° C., heating the titanium-containing circuit element in an inert, hydrogen-free atmosphere at 300° C. to 400° C. for 10 to 60 minutes. The term "circuit element" as used herein refers to any conductive structures that pass or modulate the passage of an electrical current when the device is in use; circuit elements thus include contacts, vias, lines, runners, gates, sources, drains, etc.

In a more particular aspect, the process provides a method for decreasing the electrical resistance of a titanium-containing circuit element at a conducting metal or native oxide interface comprising a first step of annealing the titanium-containing circuit element in an inert, hydrogen-free atmosphere at 300° C. to 400° C. for 10 to 60 minutes, followed by a second step of annealing the titanium-containing circuit element in a hydrogen-containing atmosphere at 350° C. to 450° C. for at least 20 minutes. The method provides an improved contact between two conducting metals joined by a layer of titanium. The conducting metals may be aluminum or aluminum-copper alloys. In some instances the alloy may contain, in addition, a small percentage of silicon, although the silicon-containing alloys do not appear to be as responsive to the process of the invention as are silicon-free alloys. The hydrogen-free atmosphere can be a vacuum, or it may be nitrogen, argon, helium or mixtures of these; the hydrogen-containing atmosphere may be pure hydrogen or a hydrogen/nitrogen mixture containing 5 or more percent hydrogen by weight. In a particular embodiment, a sandwich comprising a layer of aluminum-copper alloy, a 1 nm to 10 µm layer of titanium and a third layer of Al—Cu alloy are heated in an argon or nitrogen atmosphere at 300° C. to 400° C. for 10 minutes, and then annealed in a hydrogen or forming gas atmosphere at about 400° C. for 50 to 90 minutes.

In another aspect, the invention relates to a method for fabricating a contact comprising the sequential steps of:

(a) providing a first layer of aluminum or Al—Cu alloy;

(b) depositing and patterning a layer of dielectric on the layer of aluminum or alloy;

(c) depositing a layer of titanium over the aluminum or Al— Cu alloy;

(d) depositing a second layer of aluminum or Al—Cu alloy over the layer of titanium;

(e) annealing in an inert, hydrogen-free atmosphere at 300° C. to 400 C. for 10 to 60 minutes; and (f) annealing in a hydrogen-containing atmosphere at 350° C. to 450° C. for at least 20 minutes.

By annealing a titanium-containing conductor on a silicon-containing substrate according to the foregoing process, defect states, surface states and interface states in the silicon-containing substrate and dielectrics are passivated and the electrical resistance of the titanium-containing conductor is lowered.

In another aspect, the invention relates to a method for decreasing the electrical resistance of a titanium-containing circuit element at an interface with a silicon-containing circuit element. The method comprises a first step of heating the titanium-containing circuit element in an inert, hydrogen-free atmosphere at 300° C. to 900° C. for 10 to 60 minutes, followed by a second step of heating the titanium-containing circuit element in a hydrogen-containing atmosphere at 350° C. to 900° C. for at least 20 minutes.

In a more particular aspect, the titanium-containing circuit element is Ti/TiN in contact with a silicon-containing circuit element chosen from the group consisting of silicon and titanium silicide. This embodiment provides a low resistance contact to silicon or $TiSi_2$. When the titanium-containing circuit element is titanium metal in contact with a silicon surface, the first step of heating in a hydrogen-free atmosphere is optimally carried out at 750° to 800° C., and the second step of heating the titanium-containing circuit element in a hydrogen-containing atmosphere is carried out at 600° C. to 900° C. This embodiment provides a higher quality titanium silicide film on the silicon surface, where quality refers to the degree of thickness uniformity or resistivity uniformity.

DETAILED DESCRIPTION

Figure 1:
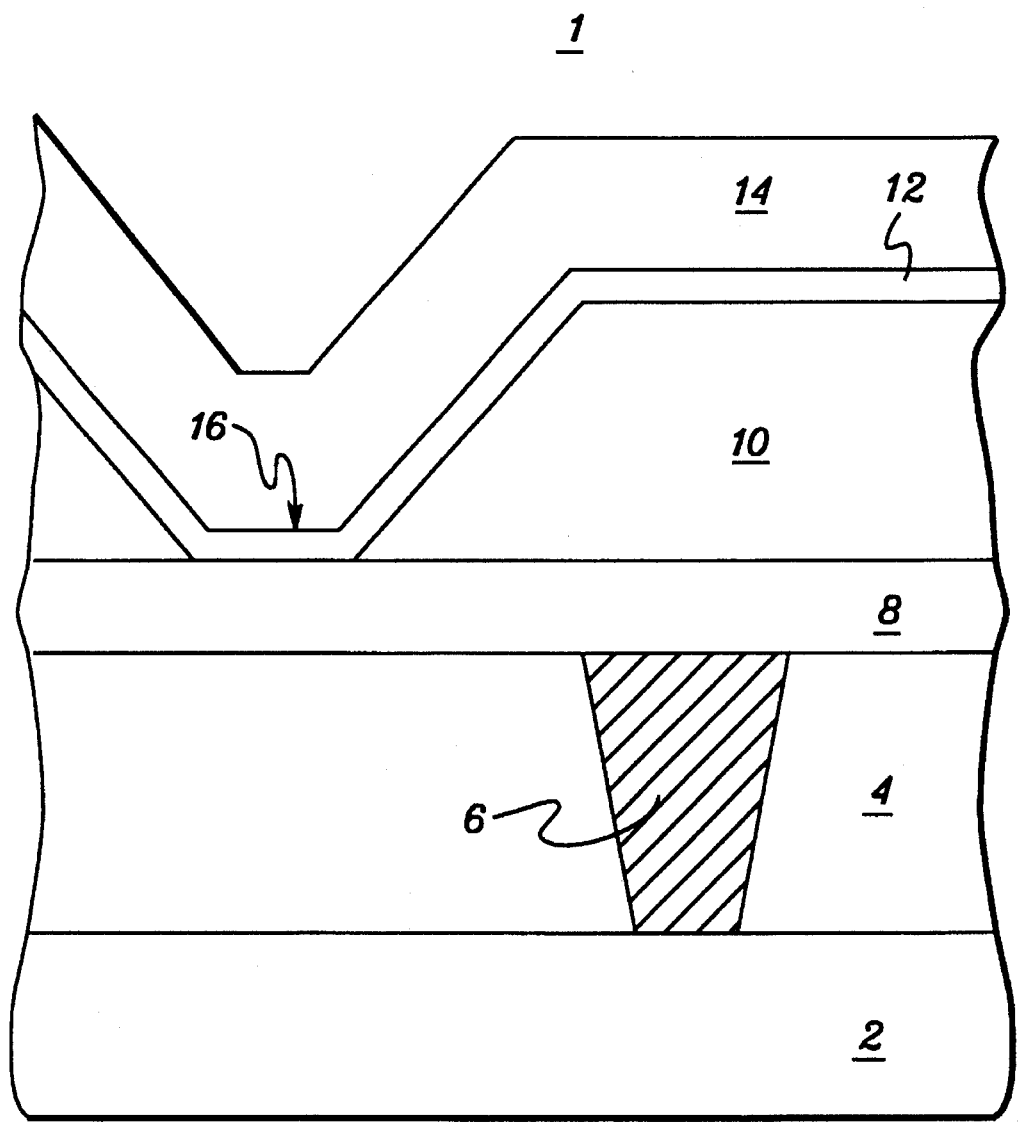
FIG. 1 is a cross section showing an embodiment of a structure prepared according to the process of the invention.

An interconnection or junction for which the instant process is suited is shown in cross section in FIG. 1. FIG. 1 depicts a semiconductor device 1 comprising a silicon substrate 2 which includes operational elements (not shown) which are beyond the purview of the present invention. Electrical contact is made with an operational element by way of a via or contact 6 through an insulating layer 4. The first level metalization (M1) 8 has been deposited. The first level metalization is commonly aluminum or an aluminum copper alloy and is often capped with a thin titanium or TiN film, but this is not relevant to the present invention since this cap is usually etched away in forming the via. An insulating layer of dielectric 10 has been deposited and patterned with a via at 16 to allow contact to the second level metalization (M2). A relatively thin layer of titanium 12 has then been deposited over the dielectric and the first level metalization and a second level metalization 14 deposited over the titanium. The second level metalization may also be aluminum or an aluminum copper alloy, in which case both it and the first level metalization 8 are most advantageously deposited by sputtering.

An alternate embodiment can be envisioned wherein a functionally equivalent junction could be formed by deposition of the titanium on the first level metalization followed by deposition of the dielectric, patterning and deposition of the second metalization layer after the metal is patterned and etched. In terms of the present invention, the two embodiments would be equivalent in that both provide an aluminum/titanium/aluminum "sandwich" at the junction. However, in practice, the second embodiment is not commonly equivalent to the first because the M1 layer is usually heated to form $TiAl_3$ with the initially deposited titanium; as a result no free titanium remains to reduce the electrical resistance. Only if this heating step were not carried out before deposition of the M2 layer would the two be equivalent.

An anneal is then carried out. The anneal serves two purposes: it relieves residual stresses in the metal and it allows the aluminum conductor films to react with the titanium underlayer to form an electromigration resistant refractory layer which enhances the reliability of the device. During the anneal, the titanium layer 12 reacts with any native oxides on the aluminum surface 8 such that the resistance of the M2 to M1 interconnection is low. Another important function of the anneal, when carried out in the presence of a hydrogen-containing atmosphere, is to minimize electrical conduction through the insulator. The effect appears to result from reducing dangling bonds, defect/impurity states and surface states, which reduces leakage currents in the circuit elements.

In order to maintain a reducing environment and provide hydrogen for the passivation of the defect states, metal anneals have been carried out in a hydrogen or hydrogen-containing ambient. It has now been discovered that the via conductance can be significantly improved by preceding the hydrogen anneal with a non-reducing "pre-anneal".

While applicants do not wish to be limited by theory, it is possible that there are competing reactions occurring when the structure is annealed in hydrogen. One reaction would be the absorption of hydrogen by the titanium layer under the M2 metalization. Since a desired reaction during the annealing is the reaction between titanium and native oxide on the aluminum surfaces at the junction, it is possible that the absorption of hydrogen by titanium may interfere with the reduction of aluminum oxide to elemental aluminum and dissolution of oxygen into the titanium. If the relative rates of the two reactions are considered, the unexpected advantage of the non-reducing preanneal can be rationalized. The absorption of hydrogen by the titanium film can be expected to occur quite readily even at relatively low temperatures. The phase diagram for the titanium and hydrogen system indicates that the solubility of hydrogen in titanium is more than 30 atom percent even at temperatures well below 400° C. The diffusion coefficient of hydrogen in titanium is thought to be approximately $10^{-7}$ $cm^2/s$ and an estimate of the characteristic diffusion length at 400° C. is roughly 5 to 10 microns in 20 to 30 minutes.

The reaction between titanium and aluminum oxide involves a chemical reduction and diffusion of the oxygen through the aluminum and titanium films. Since the chemical reduction is an endothermic reaction, the rate of this reaction at temperatures below 400° C. is expected to be relatively low. Mass transfer of the oxygen away from the interface could also be rate limiting, since oxygen diffuses substitutionally by a vacancy mechanism whereas hydrogen, being much smaller, diffuses by interstitial diffusion. The diffusion coefficient of oxygen in aluminum is approximately $10^{-12}$ $cm^2/s$ and the characteristic diffusion length is therefore probably less than 500 Å.

Based on the foregoing hypothesis, it may be that in the presence of a hydrogen-containing ambient, the titanium becomes so saturated with hydrogen that it loses the ability to reduce the oxides on the top surface of the first layer metalization. Whatever the mechanism may be, we have clearly observed a highly significant improvement in the conductivity of the junctions by a two step annealing process in which the first step is carried out in the absence of hydrogen and the second is carried out in the presence of hydrogen.

As will be seen in the examples shown below, we have employed pure nitrogen as the non-hydrogen containing ambient, but other inert gases, such as argon or helium, could also be used in other circumstances. For example, if a higher temperature were desired, while avoiding the formation of titanium nitride on accessible titanium surfaces, one might employ argon.

The first heating step is carried out for a time sufficient to allow the reaction between titanium and the surface oxides. In the case where a structure such as that shown involves an aluminum-titanium-aluminum sandwich having a titanium layer about 250 to 700 Å thick, about 20 to 30 minutes appears to be an optimal duration for the first step.

In the second step, the structure is heated at the same or higher temperature in the presence of a reducing atmosphere. Pure hydrogen or hydrogen mixtures may be used. The two-step annealing results in better bonding of the metals and in improved passivation of surface states. The resulting interconnect is therefore as robust and leakage free as an interconnect created by a single step process in a reducing atmosphere, but in addition has a much improved conductivity. It is interesting to note that even the relatively low concentration of hydrogen in forming gas (5%) is sufficient to give rise to the increased resistance that is observed in interconnects prepared by a process lacking the first step of heating in a substantially hydrogen-free atmosphere. The term "hydrogen-free atmosphere" is to be interpreted broadly so as to include, for example, a vacuum or partial vacuum, which would also be hydrogen free. In most circumstances a pure nitrogen atmosphere will be most convenient.

An example of the sort of improvement that results from the two step annealing process of the invention is presented in the table below:

| Example | Median Via Resistance[1] | 1-sigma variability |
| --- | --- | --- |
| 1 | 67 | 13 |
| 2 | 19 | <1 |
| 3 | 165 | 95.94 |
| 4 | 21 | 2.53 |

[1]measured as the resistance in ohms of a 100 via chain

In example 1, an aluminum-copper-silicon alloy/titanium interconnect was annealed in a hydrogen- containing atmosphere (forming gas) for 60 minutes at 400° C. In example 2, the same interconnect was annealed first in a nitrogen atmosphere at 400° for 10 minutes followed by the same annealing in forming gas. The resistance of the 100 via chain was reduced by 70% (from 67 $\Omega$ to 19 $\Omega$). Experiments 3 and 4 show the same effect with an aluminum-copper alloy rather than an aluminum-copper-silicon alloy. In this case the resistance is reduced by 87% (from 165 $\Omega$ to 21 $\Omega$). Also of note is the very significant decrease in variability, which is observed in both cases.

EXAMPLES

All temperatures are given in degrees Celsius.

Example 5

Reducing anneal without hydrogen-free pre-anneal.

An M1 layer of 5200 Å of 0.5% copper in aluminum was deposited by sputtering and patterned. This was coated with a thin (230 Å) film of TiN and 250 Å of amorphous silicon. A dielectric layer of 1.2 microns of $SiO_2$ was deposited by plasma-enhanced chemical vapor deposition (PECVD) of tetraethylorthosilicate. Vias were cut through the dielectric, polysilicon and TiN to the Al—Cu by RIE etch with $CHF_3$/$CF_4$/Ar; the vias were approximately 1.8 microns in diameter at the top and 0.9 microns at the bottom. A layer of titanium was deposited by sputtering; in example 5, the Ti was 700 Å thick, but this thickness was varied in later examples described below. An M2 layer of 1.15 microns of the same Al—Cu alloy was again sputter deposited and patterned so that a series of 100 M1/M2 junctions was created. The resistance was then measured after annealing and the results reported as the total resistance (and variation within 1 sigma) of the 100 junctions in series.

The stack was annealed in a flowing hydrogen atmosphere (5 L/min, ambient pressure) by heating from 25° to 400° over 40 minutes, holding at 400° for 60 minutes, and cooling from 400° to 25° over 40 minutes. The stack exhibited a series resistance greater than 165 ohms with a 1-sigma variability of greater than 100 ohms.

Example 6

Reducing anneal with hydrogen-free pre-anneal.

An M1/M2 stack was prepared as in example 5, but was annealed by heating in a nitrogen atmosphere from 25° to 400° over 40 minutes, heating at 400° for 10 minutes in nitrogen, switching the gas flow from nitrogen to hydrogen, holding at 400° for a further 50 minutes and then cooling from 400° C. to 25° over 40 minutes. The stack exhibited a series resistance of 20 ohms with a 1-sigma variability of less than 1 ohm.

Examples 7–13

Reducing anneal with hydrogen-free pre-anneal, varying Ti thickness and pre-anneal time.

An M1/M2 stack was prepared as in example 5, but having the titanium layer deposited to the thickness (in Å) shown in the table below. The stack was annealed by heating in a nitrogen atmosphere from 25° to 400° over 40 minutes, holding at 400° in nitrogen for the amount of time shown in the table below, switching the gas flow from nitrogen to hydrogen, holding at 400° for a further 50 minutes and then cooling from 400° to 25° over 40 minutes. The table shows the series resistance in ohms and the 1-sigma variability in ohms.

| Example # | Ti Thickness | Time at 400° | Resistance | Variability |
| --- | --- | --- | --- | --- |
| 7 | 250 | 10 | 16.4 | 1.3 |
| 8 | 250 | 20 | 15.82 | 0.63 |
| 9 | 250 | 30 | 15.66 | 0.67 |
| 10 | 400 | 30 | 16.44 | 0.411 |
| 11 | 700 | 10 | 19.5 | 0.636 |
| 12 | 700 | 20 | 19.56 | 0.631 |
| 13 | 700 | 30 | 19.2 | 0.610 |

The foregoing examples illustrate the two step annealing process applied to a conducting metal-titanium-conducting metal sandwich. The process is also applicable to the formation of a titanium silicide layer on a silicon surface. The silicon may be pure crystalline silicon, amorphous silicon or even doped silicon. In this case, titanium is deposited, commonly by sputtering, on a silicon substrate and the wafer is then annealed first in a hydrogen-free atmosphere at 300°–900° C., preferably 750°–800° C., followed by a second anneal in the presence of a hydrogen-containing atmosphere, this time at a temperature of 600° to 900° C.

Similarly, the two step annealing process may be advantageously applied to the annealing of a titanium/titanium nitride film overlying a silicon or titanium silicide substrate. In this case, titanium and titanium nitride are deposited by sputtering and the two step annealing process is carried out as described for the conducting metal-titanium-conducting metal sandwich. The two step annealing process results in a low resistance contact to titanium silicide or silicon surfaces.

While the invention has been particularly shown and described with reference to preferred embodiments thereof, it will be understood by those skilled in the art that other changes in form and details may be made therein without departing from the spirit and scope of the invention.

We claim:

1. A method for decreasing the electrical resistance of a titanium-containing circuit element at an aluminum, aluminum-copper, or aluminum oxide interface comprising a first step of annealing said titanium-containing circuit element in an inert, hydrogen-free atmosphere at 300° C. to 400° C. for 10 to 60 minutes, followed by a second step of annealing said titanium-containing circuit element in a hydrogen-containing atmosphere at 350° C. to 450° C. for at least 20 minutes.

2. A method according to claim 1 for improving a contact comprising a first step of annealing an aluminum-titanium-aluminum sandwich in an inert, hydrogen-free atmosphere at 300° C. to 400° C. for 10 to 60 minutes, followed by a second step of annealing said aluminum/titanium/aluminum sandwich in a hydrogen-containing atmosphere at 350° C. to 450° C. for at least 20 minutes.

3. A method according to claim 1 for improving a contact comprising a first step of annealing an aluminum-copper alloy/titanium/aluminum-copper alloy sandwich in an inert, hydrogen-free atmosphere at 300° C. to 400° C. for 10 to 60 minutes, followed by a second step of annealing said sandwich in a hydrogen-containing atmosphere at 350° C. to 450° C. for at least 20 minutes.

4. A method according to claim 1 wherein said inert, hydrogen-free atmosphere is chosen from the group consisting of nitrogen, argon, helium and mixtures thereof.

5. A method according to claim 1 wherein said hydrogen-containing atmosphere is from 5 to 100% hydrogen, with the remainder being nitrogen.

6. A method according to claim 5 comprising a first step of annealing a layer of Al-Cu alloy on a 1 nm to 10 μm layer of titanium on an Al-Cu alloy in an argon or nitrogen atmosphere at 300° C. to 400° C. for 10 minutes, followed by a second step of annealing in a hydrogen or forming gas atmosphere at about 400° C. for 50 to 90 minutes.

7. A method for fabricating a contact comprising the sequential steps of:
(a) providing a first layer of aluminum or Al—Cu alloy;
(b) depositing and patterning a layer of dielectric on said layer of aluminum or Al—Cu alloy;
(c) depositing a layer of titanium on said layer of aluminum or Al—Cu alloy;
(d) depositing a second layer of aluminum or Al—Cu alloy on said layer of titanium;

(e) annealing in an inert, hydrogen-free atmosphere at 300° C. to 400° C. for 10 to 60 minutes; and
(f) annealing in a hydrogen-containing atmosphere at 350° C. to 450° C. for at least 20 minutes.

8. A method according to claim 7 wherein said inert, hydrogen-free atmosphere is chosen from the group consisting of a vacuum, a nitrogen atmosphere, an argon atmosphere, a helium atmosphere, and a mixture of two or more of nitrogen, helium and argon.

9. A method according to claim 7 wherein said hydrogen-containing atmosphere is from 5 to 100% hydrogen, with the remainder being nitrogen.

10. A method according to claim 7 wherein a second layer of Al—Cu alloy is deposited on a 1 nm to 10 μm layer of titanium and is annealed in an argon or nitrogen atmosphere at about 400° C. for 10 minutes, followed by annealing in a hydrogen or forming gas atmosphere at 350° C. to 450° C. for 50 to 90 minutes.

11. A method for decreasing the electrical resistance of a titanium-containing circuit element at an interface with a silicon circuit element comprising a first step of heating said titanium-containing circuit element in an inert, hydrogen-free atmosphere at 300° C. to 900° C. for 5 to 60 minutes, followed by a second step of heating said titanium-containing circuit element in a hydrogen-containing atmosphere at 350° C. to 900° C. for at least 20 minutes.

12. A method according to claim 11 wherein said first step of heating said titanium-containing circuit element in an inert, hydrogen-free atmosphere is carried out at 750° to 800° C.

13. A method according to claim 11 wherein said titanium-containing circuit element is Ti/TiN in contact with a silicon circuit element, whereby a low resistance contact to silicon is provided.

14. A method according to claim 11 wherein said titanium-containing circuit element is titanium metal in contact with a silicon surface and said second step of heating said titanium-containing circuit element in a hydrogen-containing atmosphere is carried out at 600° C. to 900° C.

15. A method for decreasing the electrical resistance of a titanium-containing circuit element at an interface with a titanium silicide circuit element comprising a first step of heating said titanium-containing circuit element in an inert, hydrogen-free atmosphere at 300° C. to 900° C. for 5 to 60 minutes, followed by a second step of heating said titanium-containing circuit element in a hydrogen-containing atmosphere at 350° C. to 900° C. for at least 20 minutes.

16. A method according to claim 15 wherein said first step of heating said titanium-containing circuit element in an inert, hydrogen-free atmosphere is carried out at 750° to 800° C.

17. A method according to claim 15 wherein said titanium-containing circuit element is Ti/TiN in contact with a titanium silicide circuit element, whereby a low resistance contact is provided.

18. A method according to claim 15 wherein said titanium-containing circuit element is titanium metal in contact with a titanium silicide surface and said second step of heating said titanium-containing circuit element in a hydrogen-containing atmosphere is carried out at 600° C. to 900° C.

* * * * *